(12) United States Patent
Stoller

(10) Patent No.: US 6,889,752 B2
(45) Date of Patent: May 10, 2005

(54) SYSTEMS AND METHODS FOR WEATHERPROOF CABINETS WITH MULTIPLE COMPARTMENT COOLING

(75) Inventor: Harry R. Stoller, Basking Ridge, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 96 days.

(21) Appl. No.: 10/193,050

(22) Filed: Jul. 11, 2002

(65) Prior Publication Data
US 2004/0007347 A1 Jan. 15, 2004

(51) Int. Cl.[7] ............................................. F25B 29/00
(52) U.S. Cl. ..................... 165/47; 165/122; 454/184
(58) Field of Search ...................... 165/122, 47, 80.2, 165/80.3; 361/724, 600, 679, 688, 689, 690; 62/255, 440, 441, 452, 453, 259.2; 312/236; 454/184

(56) References Cited

U.S. PATENT DOCUMENTS

| | | | | |
|---|---|---|---|---|
| 3,559,728 A | * | 2/1971 | Lyman et al. ................ 165/122 |
| 4,338,996 A | * | 7/1982 | Frank ........................... 165/122 |
| 4,365,666 A | * | 12/1982 | Seifert .................... 165/104.33 |
| 4,535,386 A | * | 8/1985 | Frey et al. .................... 361/690 |
| 4,582,130 A | * | 4/1986 | Modschiedler .............. 361/694 |
| 4,790,373 A | * | 12/1988 | Raynor et al. ............... 165/122 |
| 4,949,218 A | | 8/1990 | Blanchard et al. .......... 361/384 |
| 5,040,095 A | | 8/1991 | Beaty et al. ................. 361/384 |
| 5,150,277 A | | 9/1992 | Bainbridge et al. ......... 361/384 |
| 5,329,736 A | * | 7/1994 | Sodervall ...................... 62/255 |
| 5,467,250 A | | 11/1995 | Howard et al. ............. 361/696 |
| 5,475,562 A | * | 12/1995 | Gow ........................... 312/236 |
| 5,505,046 A | * | 4/1996 | Nelson et al. ............... 165/236 |
| 5,570,740 A | | 11/1996 | Flores et al. ............ 165/104.34 |
| 5,688,169 A | | 11/1997 | Duong et al. ................ 454/184 |
| 5,832,988 A | | 11/1998 | Mistry et al. ............... 165/103 |
| 6,026,891 A | * | 2/2000 | Fujiyoshi et al. ....... 165/104.33 |
| 6,067,223 A | | 5/2000 | Diebel et al. ................ 361/676 |
| 6,082,441 A | | 7/2000 | Boehmer et al. ........... 165/80.3 |
| 6,088,225 A | | 7/2000 | Parry et al. .................. 361/704 |
| 6,104,608 A | * | 8/2000 | Casinelli et al. ............ 454/184 |
| 6,119,767 A | * | 9/2000 | Kadota et al. ......... 165/104.33 |
| 6,119,768 A | | 9/2000 | Dreier et al. ........... 165/104.33 |
| 6,123,266 A | * | 9/2000 | Bainbridge et al. ........ 62/259.3 |
| 6,134,109 A | * | 10/2000 | Muller et al. ............... 361/700 |
| 6,149,254 A | | 11/2000 | Bretschneider et al. .. 312/223.1 |
| 6,164,369 A | * | 12/2000 | Stoller ......................... 454/184 |
| 6,201,694 B1 | * | 3/2001 | Turunen ..................... 361/695 |
| 6,412,286 B1 | * | 7/2002 | Park et al. .................. 62/457.1 |
| 6,462,944 B1 | * | 10/2002 | Lin ............................. 361/695 |
| 6,533,031 B1 | * | 3/2003 | Garcia et al. ................. 165/59 |
| 6,704,198 B2 | * | 3/2004 | Replogle et al. ............ 165/122 |
| 6,742,583 B2 | * | 6/2004 | Tikka .......................... 165/291 |

FOREIGN PATENT DOCUMENTS

JP 09283965 * 10/1997 ................ 165/80.4

* cited by examiner

*Primary Examiner*—Ljiljana Ciric
(74) *Attorney, Agent, or Firm*—Thomas, Kayden, Horstemeyer & Risley, L.L.P.

(57) ABSTRACT

A weatherproof cabinet with multiple-compartment cooling includes a housing and a door attached to the housing. The door includes a heat exchanger core, a first duct located at least partially between the heat exchanger door and an exterior of the door, and a second duct located at least partially between the heat exchanger door and an electronics compartment. The door also includes an inlet vent and an outlet vent that are pneumatically interconnected with the first duct. A fan is located at least partially within the first duct and is operative to draw external air into the first duct via the inlet vent, direct at least the first portion of the external air across the heat exchanger core, and then direct the first portion of the external air out of the first duct via the outlet vent. A partition is located within the first duct and separates the inlet vent from the outlet vent so that external air is not drawn into the first duct via the outlet vent during operation of the fan.

6 Claims, 4 Drawing Sheets

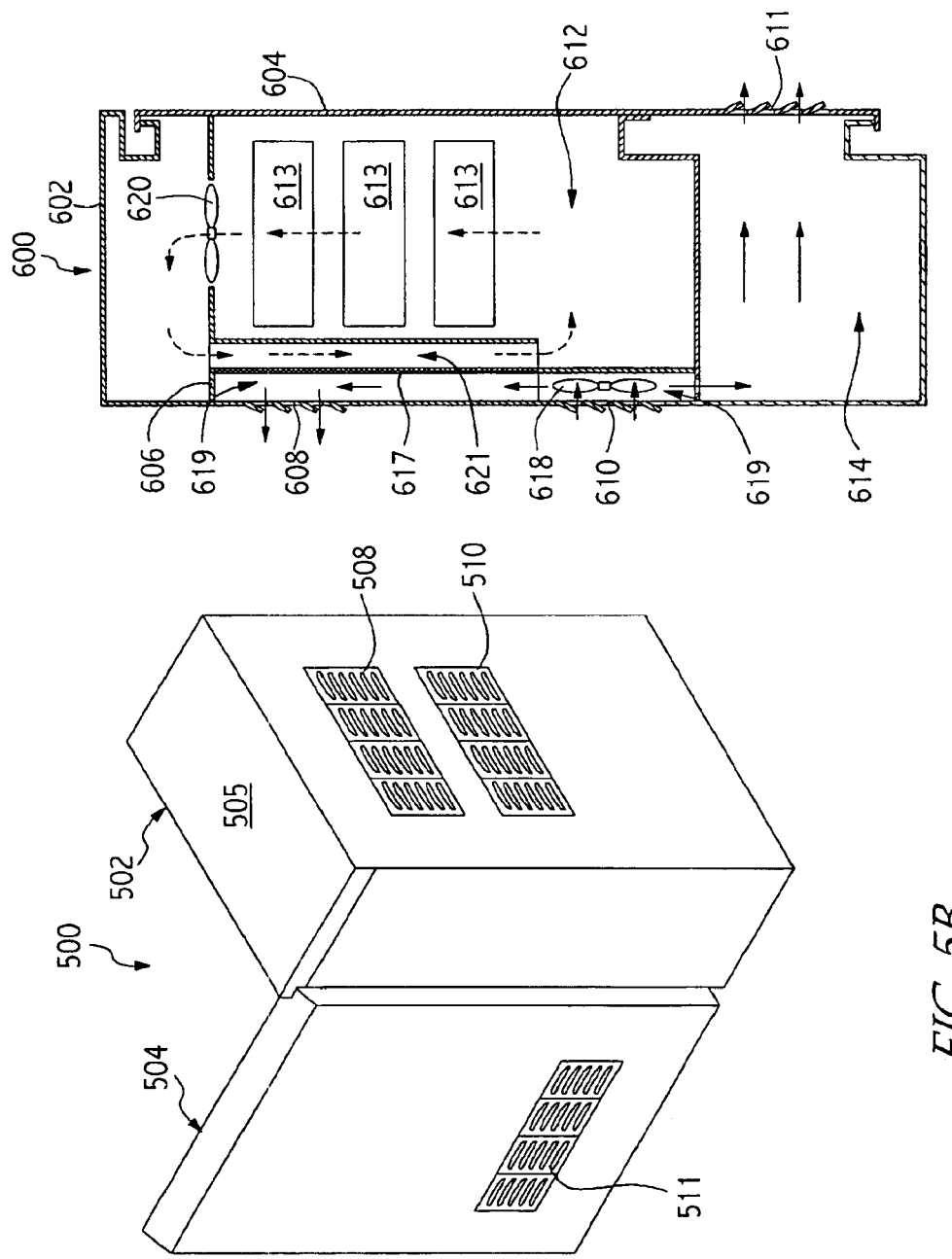

US 6,889,752 B2

SYSTEMS AND METHODS FOR WEATHERPROOF CABINETS WITH MULTIPLE COMPARTMENT COOLING

TECHNICAL FIELD OF THE INVENTION

The present invention is generally related to telecommunications enclosures and, more particularly, is related to systems and methods for weatherproof cabinets with multiple compartment cooling.

BACKGROUND OF THE INVENTION

The continuing development of newer generation telecommunications equipment has provided the benefit of a steady increase in the power density of such equipment (i.e., an increase in operating capacity using the same size or even smaller components). As a result of this increasing power density, newer generation telecommunications equipment dissipates more heat during operation than older generation equipment. There is a growing awareness that telecommunications equipment, such as electronic equipment and back-up power batteries, experience decreased operating performance and life-span when operated at high temperatures. Therefore, newer generation telecommunications equipment that is installed in weatherproof cabinets requires sufficient cooling to ensure optimal operating performance and life-span.

A number of existing weatherproof cabinets rely on the natural convection of the heat dissipated from enclosed equipment to the exterior cabinet walls where it is then conducted out to the external environment. However, such natural convection cooling techniques are typically not sufficient to provide the cooling needed to promote optimal performance of newer generation telecommunications equipment. Other existing weatherproof cabinets attempt to provide sufficient cooling by various methods. However, such existing cabinets typically fail to provide sufficient battery cooling or fail to provide sufficient battery cooling without the undesirable accumulation of excessive particles and debris on the batteries and/or other enclosed equipment, which typically also causes decreased operating performance and life-span.

Based on the foregoing, it should be appreciated that there is a need for improved systems and methods which address the above-mentioned, as well as other, shortcomings of existing systems and methods.

SUMMARY OF THE INVENTION

The present invention provides systems and methods for weatherproof cabinets with multiple compartment cooling.

Briefly described, one embodiment of the system, among others, includes a housing. Disposed within the housing is an electronics compartment, a battery compartment, an internal fan, and an external fan. A door is attached to the housing. Additionally, a heat exchanging device is disposed within the cabinet.

The present invention can also be viewed as providing methods for weatherproof cabinets with multiple compartment cooling. In this regard, one embodiment of such a method, among others, can be broadly summarized by the following: providing a weatherproof cabinet with multiple compartments and a heat exchanging device, transferring heat from an electronics compartment to the heat exchanging device, transferring heat from the heat exchanging device to outside of the cabinet, and transferring heat from a battery compartment to outside of the cabinet.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 5B is a rear perspective view of a weatherproof cabinet with multiple compartment cooling that has a wall mounted heat exchanging unit.

FIG. 6 is a cutaway side view of an embodiment of a weatherproof cabinet with multiple compartment cooling such as that depicted in FIGS. 5A–5B that has a wall mounted heat exchanging unit.

DETAILED DESCRIPTION

The invention now will be described more fully with reference to the accompanying drawings. The invention may, however, be embodied in many different forms and should not be construed as limited to the embodiments set forth herein; rather, these embodiments are intended to convey the scope of the invention to those skilled in the art. Furthermore, all "examples" given herein are intended to be non-limiting.

Figure 1B:
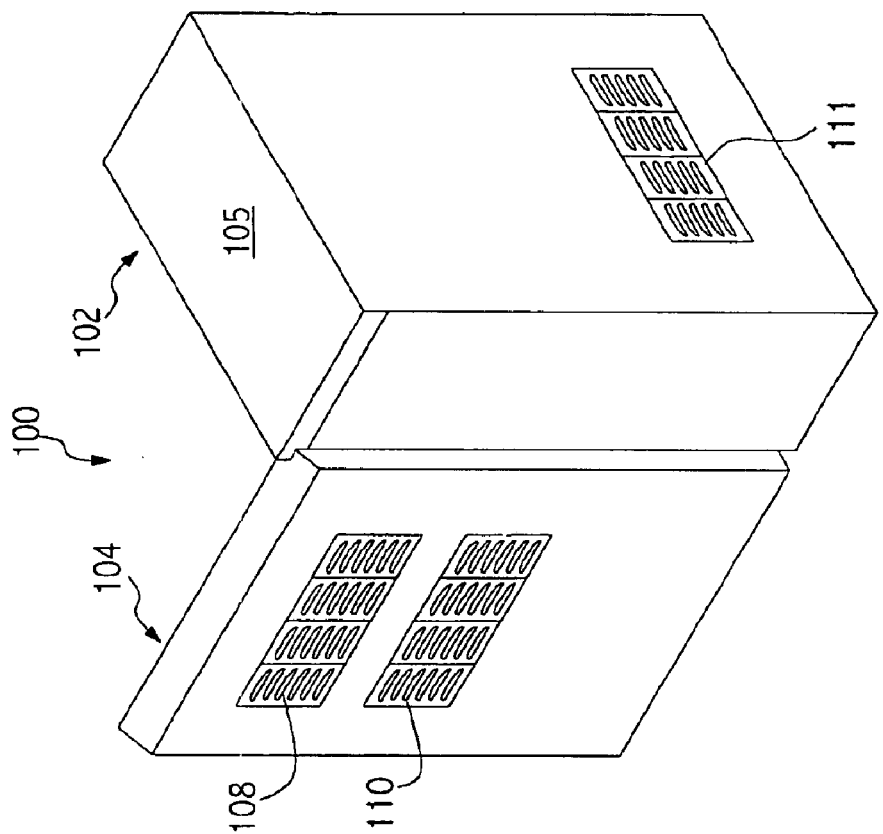
FIG. 1B is a rear perspective view of a weatherproof cabinet with multiple compartment cooling that has a door mounted heat exchanging unit.
Figure 1A:
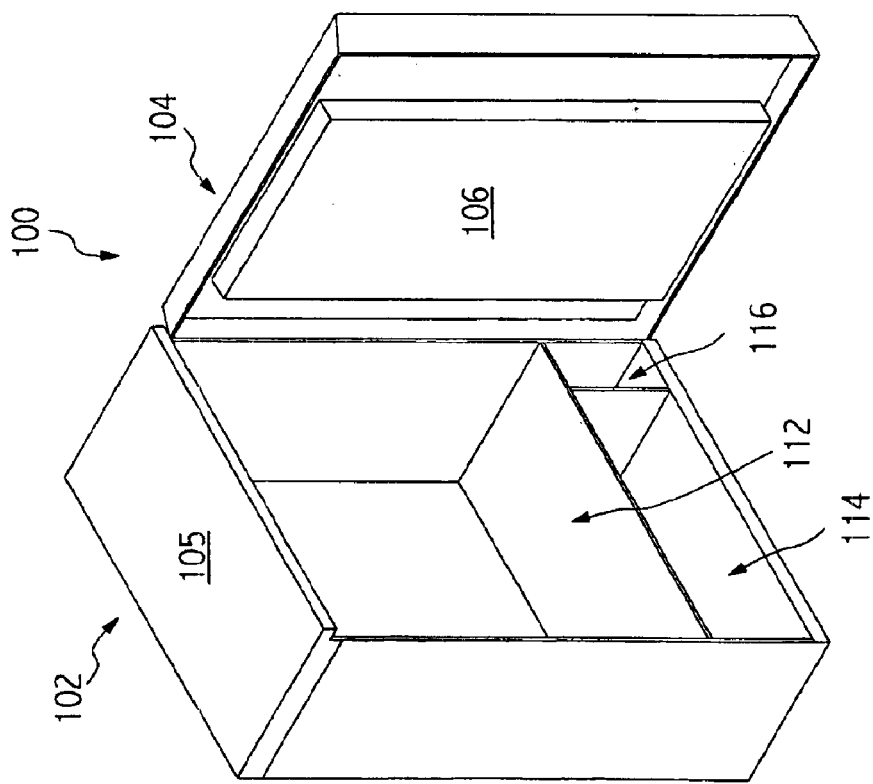
FIG. 1A is a front perspective view of a weatherproof cabinet with multiple compartment cooling that has a door mounted heat exchanging unit.

Referring now to FIGS. 1A and 1B, a front and rear perspective view, respectively, of a weatherproof cabinet 100 with multiple compartment cooling that has a door mounted heat exchanging unit is shown. The cabinet 100 includes a housing 102 and a door 104. Although not depicted, in some embodiments, the cabinet 100 may include more than one door—for example, the cabinet 100 may include one or more doors on opposite sides of the cabinet 100 or adjacent to each other on the same side of the cabinet 100. The housing 102 typically has several walls of various shapes and sizes as depicted, for example, in FIGS.

1A–1B. The door 104 is typically attached to one or more walls of the housing 102 by some means for attachment, such as hinges, screw fasteners, or other elements, which may be known in the art. A heat exchanging unit 106 is typically mounted to the door 104. Although not depicted, in some embodiments, the cabinet 100 may include more than one heat exchanging unit mounted to it. The heat exchanging unit 106 will be discussed in further below with respect to other figures.

As depicted in FIG. 1B, the door 104 of the cabinet 100 also typically includes one or more vents 108, 110. Although depicted in a vertical arrangement in FIG. 1B, in some embodiments, the vents 108, 110 may be positioned in other arrangements, such as horizontal. There is also typically one or more vents 111 located on the rear wall of the housing 102, as also depicted in FIG. 1B. These vents 111 may alternately be included on another wall of the housing 502, instead of the rear wall, or additional vents (not depicted) may be included on other walls of the housing 502 as well. The vents 108, 110, 111 may be provided in various sizes, shapes, and configurations and typically provide one or more openings for the through-flow of air in the cabinet 100. Moreover, the vents 108, 110, 111 may be shaped or otherwise configured to minimize the ingress of moisture and debris into the cabinet 100, for example, in the form of wind-swept rain, dust, or other particles. The vents 108, 110, 111 may also be at least partially covered by some means for filtering (not depicted), such as filter media, screening, or other elements, which may be known in the art, to minimize the ingress of moisture and debris into the cabinet 100.

In order to facilitate the weatherproof characteristics of the cabinet 100, the housing 102 and door 104 may include other features that promote such characteristics. For example, as depicted in FIGS. 1A–1B, the top wall 105 of the housing 102 may extend over the door 104 when it is in a closed position in order to minimize the accumulation and ingress of moisture, for example from rain or snow, at the top section where the closed door 104 and housing 102 meet. As another example, the door 104 and/or the surface of the housing 102 that contacts the door 104 when it is closed may include some means for sealing (not depicted) the cabinet 100, such as one or more gaskets, seals, or other elements, which may be known in the art. Other elements that facilitate the weatherproof characteristics of the cabinet 100, and which may be known in the art, may be included as part of the cabinet 100 within the scope of the invention.

As depicted in FIG. 1A, the interior of the cabinet 100 may include several compartments. The cabinet 100 typically includes a main compartment 112 that usually serves to enclose electronic equipment that is installed in the cabinet 100. The main compartment 112 is typically formed of one or more walls of the housing 102. Alternately, in some embodiments, the main compartment 112 may be formed of one or more separate walls from the walls of the housing 102. In such embodiments, the main compartment 112 may be spaced from the walls and/or compartments of the cabinet 100 to provide thermal insulation of the main compartment 112 from the other compartments of the cabinet 100. Typically, the door 104 serves as a wall of the main compartment 112, for example as the front wall, and the main compartment 112 provides a weatherproof enclosure to equipment installed within it when the door 104 is in a closed position.

The cabinet 100 typically also includes an auxiliary compartment 114 which usually encloses batteries and related equipment. As depicted in FIG. 1A, one or more walls of the auxiliary compartment 114 may be formed from the walls of the housing 102. Further, the door 104 typically serves as a wall of the auxiliary compartment 114, for example as the front wall. In some embodiments, however, a separate panel may be provided as such wall of the auxiliary compartment 114 and may be attached to the compartment 114, for example, by some means for attachment as discussed above.

An entrance compartment 116 is also typically included in the cabinet 100. The entrance compartment 116 typically provides a location on the cabinet 100 where one or more power cables, telecommunications cables, and/or other components can be routed into the cabinet 100, for example, from one or more conduits or a trench. In that regard, the bottom wall of the entrance compartment 116 typically has one or more openings (not depicted) for cables and/or other components to be passed through and into the cabinet 100. Furthermore, other walls of the entrance compartment 116 may also have openings (not depicted) so that cables or other components can be routed to other compartments within the cabinet 100. One or more of the openings in the walls of the entrance compartment 116 may be fitted with some means for connecting (not depicted), such as a cable connector, a strain relief cable connector, or other components, which may be known in the art—such means for connecting may also provide a seal or barrier between the compartments. As depicted in FIG. 1A, one or more walls of the entrance compartment 116 may be formed from the walls of the housing 102. Further, the door 104 typically serves as a wall of the entrance compartment 116, for example as the front wall. In some embodiments, however, a separate wall panel may be provided and attached to the compartment 116, for example, by some means for attachment as discussed above.

The cabinet 100 may also include other compartments that serve various purposes within the scope of the invention. The various elements of the cabinet 100, such as the walls of the housing 102 and the door 104, may be constructed of various materials, such as metal, plastic, or other materials, which may be known in the art. Factors such as thermal characteristics, strength, and durability, for example, may affect the type of materials that the various elements of the cabinet 100 are constructed from.

Figure 2:
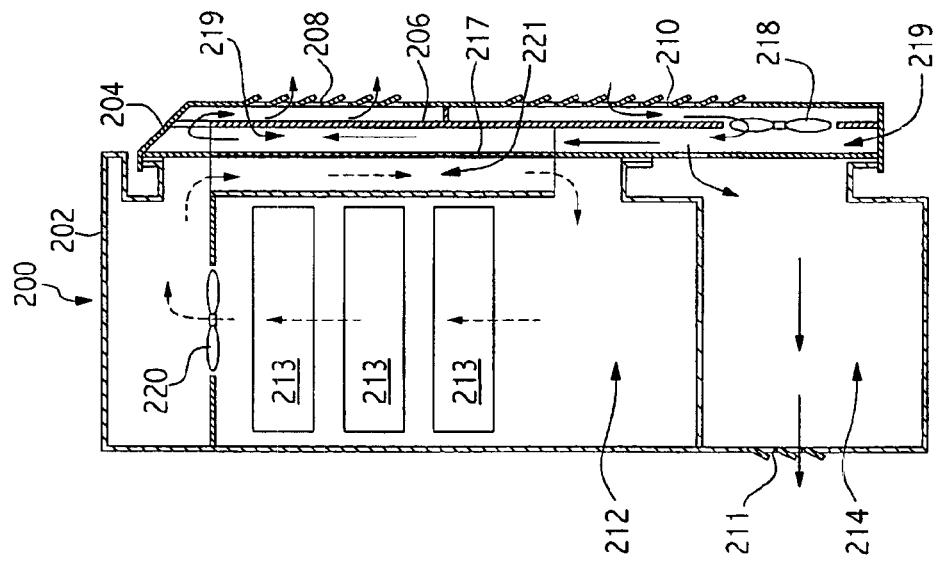
FIG. 2 is a cutaway side view of an embodiment of a weatherproof cabinet with multiple compartment cooling such as that depicted in FIGS. 1A–1B that has a door mounted heat exchanging unit.

FIG. 2 is a cutaway side view of an embodiment of a weatherproof cabinet 200 with multiple compartment cooling such as that depicted in FIGS. 1A–1B that has a door mounted heat exchanging unit. The cabinet 200 has many substantially similar characteristics to the cabinet 100 discussed above with respect to FIGS. 1A–1B. The cabinet 200 has a housing 202, which typically surrounds various compartments within the cabinet 200, and a door 204, which typically serves as a wall (such as the front wall) of the cabinet 200 and the various compartments within it when the door 204 is in a closed position. The housing 202 and door 204 have substantially similar characteristics to the housing 102 and door 104, respectively, that were described above with respect to FIGS. 1A–1B. In that regard, the rear wall of the housing 202 typically includes one or more rear vents 211, and the door 204 typically includes one or more upper vents 208 and one or more lower vents 210, as depicted in FIG. 2. These vents 211, 208, and 210 are substantially similar to the vents 111, 108, and 110, respectively, described above with respect to FIG. 1B. Furthermore, the door 204 typically has a heat exchanging unit 206 mounted to it, which will be described further below.

The cabinet 200 includes an electronics compartment 212 which typically holds electronic equipment 213, such as telecommunications equipment. The electronics compartment 212 typically has substantially similar characteristics to the main compartment 112 discussed above with respect to FIG. 1A. For example, the electronics compartment 212 is typically formed of one or more walls of the housing 202, although in some embodiments, the electronics compartment 212 may be formed of one or more separate walls from the walls of the housing 202. In addition to the weatherproof environment generally provided within the cabinet 200, the electronics compartment 212, in some embodiments, may further provide a water-tight and/or air-tight environment to the electronics equipment 213 installed within it when the door 204 of the cabinet 200 is in a closed position.

The cabinet 200 also typically includes a battery compartment 214 which typically holds one or more batteries and related equipment. The battery compartment 214 is typically substantially similar in characteristics to the auxiliary compartment 114 discussed above with respect to FIG. 1A. As depicted in FIG. 2, the rear vents 211 typically provide an opening at the rear of the battery compartment 214 to allow air or other gaseous flow through the battery compartment 214, for example hydrogen produced by batteries—this feature will be discussed further below.

Although not shown in FIG. 2, a cable entrance compartment is also typically included in the cabinet 200. This cable entrance compartment typically has substantially similar characteristics to the entrance compartment 116 discussed above for FIG. 1A. For example, the cable entrance compartment typically provides a location where one or more power cables, telecommunications cables, and/or other components can be routed into the cabinet 200. The cable entrance compartment may also include one or more openings in the walls of the cable entrance compartment to facilitate the flow of air through the cabinet 200.

As discussed above, the cabinet 200 includes a heat exchanging unit 206 that is typically mounted to the door 204, as depicted in FIG. 2. The heat exchanging unit 206 may have various features and configurations, which may be known in the art, such as those of a typical weatherproof heat exchanger, for example. Typically, the heat exchanging unit 206 includes at least several elements. The heat exchanging unit 206 typically includes a heat exchanging core 217. The heat exchanging core 217 may include one or more extended or convoluted surfaces (such as fins), heat pipes, thermoelectric devices (for example, that operate by Peltier effect), or other heat exchanging elements which may be known in the art. The heat exchanging unit 206 also typically includes an external duct 219. The external duct 219 typically directs external air across the heat exchanging core 217. As depicted in FIG. 2, the upper and lower vents 208, 210 typically provide one or more openings through the door 204 into the external duct 219. Thus, external air may flow in and/or out of the external duct 219 through the upper and lower vents 208, 210.

The heat exchanging unit 206 also typically includes an internal duct 221. The internal duct 221 typically directs air circulated within one or more compartments of the cabinet 200 across the heat exchanging core 217. The cabinet 200 may further include one or more external fans 218 that may, for example, be integrated elements of the heat exchanging unit 206, as depicted in FIG. 2. The external fans 218 typically function to circulate external air through the external duct 219 of the heat exchanging unit 206. The external fans 218 may be provided by various types and configurations of fans which may be known in the art. Typically, the external fans 218 have at least a motor and one or more fan blades. Further, the external fans 218 are typically mounted at a location near or within the external duct 219 by some means for mounting (not depicted), such as bolts, studs, or other elements which may be known in the art. The external fans 218 may be powered by electrical power provided to the cabinet 200 by various means. For example, power may be provided by one or more power cables that pass into the cabinet 200 at the cable entrance compartment (not shown) or by one or more batteries which are installed in the battery compartment 214.

As depicted by the solid flow lines in FIG. 2, the external fans 218 typically cause air to flow through the upper vents 208 and the lower vents 210 and circulate through the external duct 210, including across the heat exchanging core 217. In that regard, the upper and lower vents 208, 210 may function as either inlet or outlet vents of the heat exchanging unit 206 in various embodiments of the invention. For example, as depicted by the solid flow lines in FIG. 2, the lower vents 210 may function as inlet vents while the upper vents 208 may function as outlet vents. In that regard, the operation of the external fans 218 typically causes external air to be drawn into the lower vents 210, circulated through the external duct 219 across the heat exchanging core 217, and blown out of the upper vents 210. Typically, this circulation of external air across the heat exchanging core 217 transfers heat from the core 217 to the external air and subsequently out of the cabinet 200. As mentioned, in other embodiments, the external fans 218 may cause the flow of external air through the vents 208, 210 and the external duct 219 to vary from the foregoing description.

As also depicted by the solid flow lines in FIG. 2, the external fans 218 typically cause external air to flow through one or more openings in the external duct 219, into the battery compartment 214, and subsequently out of the rear vents 211. Typically, the main flow of external air through the cabinet 200 flows through the external duct 219 and across the heat exchanging core 217, while a lesser flow of external air flows through the battery compartment 214. However, the volume and pressure of the external air that flows through the battery compartment 214 may be varied by varying the size and/or shape of the openings between the external duct 219 and the battery compartment 214 and by varying the size, shape, and/or configuration of the rear vents 211. In that regard, the flow of external air through the battery compartment 214 may be varied to reduce or prevent the undesirable accumulation of excessive particles and debris on equipment enclosed in the battery compartment 214 and to control the amount of cooling supplied to the battery compartment 214. Although not depicted in FIG. 2, external air flow may be provided through other compartments, for example the cable entrance compartment (not shown), in a similar manner to the external air flow provided through the battery compartment 214.

The cabinet 200 also typically includes one or more internal fans 220, as depicted in FIG. 2. Similar to the external fans 218 described above, the internal fans 220 may be provided by various types and configurations of fans which may be known in the art. Furthermore, the internal fans 220 also have at least a motor and one or more fan blades. The internal fans 220 are typically mounted in the electronics compartment 212 by some means for mounting (not depicted), such as bolts, studs, or other elements which may be known in the art. As depicted in FIG. 2, the electronics compartment 212 may also include one or more internal walls that serve to facilitate the circulation of internal air by, for example, channeling the air to the internal fans 220 and past the electronics equipment 213. Similar to the external fans 218, the internal fans 220 may also be powered by electrical power provided to the cabinet 200 by various means, such as by one or more power cables that pass into the cabinet 200 at the cable entrance compartment (not shown) or by one or more batteries which are installed in the battery compartment 214.

As depicted by the dashed flow lines in FIG. 2, the internal fans 220 typically circulate air within the electronics compartment 212. In that regard, the internal fans 220 typically cause internal air to circulate around the electronic equipment 213 enclosed within the electronics compartment 212 and through the internal duct 221 of the heat exchanging unit 206. This circulation of internal air typically causes the transfer of heat generated by the electronics equipment 213 to the heat exchanging core 217 of the heat exchanging unit 206. Thus, the circulation of internal air around the electronics equipment 213 by the internal fans 220 provides cooling to the electronics equipment 213. The heat that is transferred to the heat exchanging core 217 is typically transferred out of the cabinet 200 by the external air flow that circulates through the external duct 219 across the heat exchanging core 217, as depicted by the solid flow lines in FIG. 2. Additional heat transfer out of the cabinet 200 from the electronics compartment 212, the battery compartment 214, and/or other compartments may also occur through the walls of the cabinet 200.

The cooling provided to the electronics compartment 212 and to other compartments of the cabinet 200, such as the battery compartment 214, may also be varied by varying the speed of the external fans 218 and/or the internal fans 220. Moreover, cooling to the various compartments of the cabinet 200 may also be varied by cycling the operation of the external fans 218 and/or internal fans 220 on and off for various time durations. In that regard, the operation of the external fans 218 and/or internal fans 220 may, for example, be activated dependent on the temperature in one or more compartments of the cabinet 200. When the external fans 218 and/or the internal fans 218 are off, the compartments may still be provided with some cooling. For example, heat from the compartments may be transferred out of the cabinet 200 through the vents 208, 210, 211. Furthermore, gases and/or other byproducts generated by equipment held in one or more of the compartments of the cabinet 200, for example hydrogen from the batteries held in the battery compartment 214, may be vented through one or more of the vents 208, 210, 211.

Figure 3:
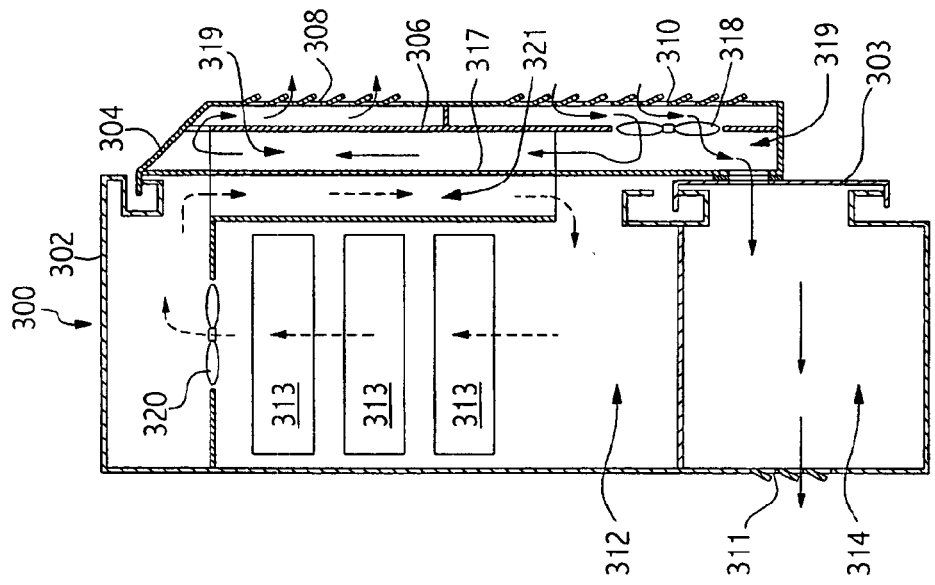
FIG. 3 is a cutaway side view of another embodiment of a weatherproof cabinet with multiple compartment cooling such as that depicted in FIGS. 1A–1B that has a door mounted heat exchanging unit.

FIG. 3 is a cutaway side view of another embodiment of a weatherproof cabinet with multiple compartment cooling such as that depicted in FIGS. 1A–1B that has a door mounted heat exchanging unit. In that regard, the cabinet 300 has many substantially similar characteristics to the cabinets 100 and 200 described above with respect to FIGS. 1A–1B and 2 respectively. The cabinet 300 includes a housing 302 with multiple compartments and a door 304 with a heat exchanging unit mounted to it. The rear wall of the housing 302 typically includes one or more rear vents 311, and the door 304 typically includes one or more upper vents 308 and one or more lower vents 310.

The cabinet 300 also includes an electronics compartment 312 which typically holds electronic equipment 313, such as telecommunications equipment, and may provide a watertight and/or air-tight environment to the electronics equipment 313 when the door 304 is in a closed position. The cabinet 300 also includes a battery compartment 314 which typically holds one or more batteries and related equipment, and the rear vents 311 typically provide an opening at the rear of the battery compartment 314 to allow air or other gaseous flow through the battery compartment 314, for example hydrogen produced by batteries. The cabinet 300 may also include a cable entrance compartment (not shown) which typically provides a location where one or more power cables, telecommunications cables, and/or other components can be routed into the cabinet 300.

As mentioned above, the cabinet 300 also includes a heat exchanging unit 306 that is typically mounted to the door 304, as depicted in FIG. 2. Typically, the heat exchanging unit 306 includes at least a heat exchanging core 317, an external duct 319, and an internal duct 321. The cabinet 300 also typically includes one or more external fans 318 that may, for example, be integrated elements of the heat exchanging unit 306. The external fans 318 are typically mounted at a location near or within the external duct 319 by some means for mounting (not depicted), such as those discussed above with respect to FIG. 2. The external fans 318 may be powered by electrical power provided to the cabinet 300 by various means, such as by one or more power cables that pass into the cabinet 300 at the cable entrance compartment (not shown) or by one or more batteries which are installed in the battery compartment 314.

The cabinet 300 also typically includes one or more internal fans 320 that are typically mounted in the electronics compartment 312 by some means for mounting (not depicted), such as those discussed above with regard to FIG. 3. The electronics compartment 312 may also include one or more internal walls that serve to facilitate the circulation of internal air by, for example, channeling the air to the internal fans 320 and past the electronics equipment 313. The internal fans 320 may also be powered by various means such those described with respect to the external fans 318.

The foregoing elements of the cabinet 300 are at least substantially similar in characteristics to their named counterparts discussed above with respect to FIGS. 1A–1B and 2. Further, the operation of the elements, for example, to cool the compartments of the cabinet 300 is substantially similar to the operation of the elements described above with respect to the cabinet 200 of FIG. 2. Thus, cooling is typically provided to the electronics compartment 312 as a result of the internal fans 320 causing the circulation of internal air, as depicted by the dashed flow lines, across the electronic equipment 313, through the internal duct 321, and across the heat exchanging core 317, where the heat is absorbed. The heat is then transferred out of the cabinet 300 as a result of the external fans 318 causing the circulation of external air, as depicted by the solid flow lines, into the external duct 319 through the lower vents 310, across the heat exchanging core 317, and out of the external duct 319 through the upper vents 308. Additionally, cooling is typically provided to the battery compartment 314 as a result of the external fans 318 causing external air to flow, as also depicted by the solid flow lines, through the lower vents 310 into the battery compartment 314 and out of the rear vents 311.

In variation to the cabinet 200 of FIG. 2, however, this embodiment of the cabinet 300 includes a lower panel or door 303. This lower panel 303 typically covers the front of the battery compartment 314, instead of the door 304, and the lower panel 303 may also cover the front of the cable entrance compartment (not shown). The lower panel 303 is typically attached to one or more walls of the housing 302 by some means for attachment, such as hinges, screw fasteners, or other elements, which may be known in the art. The lower panel 303 also typically includes one or more openings that align with one or more openings in the external duct 319 of the heat exchanging unit 306 to allow the flow of external air through the battery compartment 314, as depicted by the solid flow lines.

The volume and pressure of the external air that flows through the battery compartment 314 may be varied by varying the size and/or shape of the openings in the lower panel 303 and the external duct 319 and by varying the size, shape, and/or configuration of the rear vents 311. Thus, the flow of external air through the battery compartment 314 may be varied to, for example, reduce or prevent the undesirable accumulation of excessive particles and debris on equipment enclosed in the battery compartment 314 and control the amount of cooling supplied to the battery compartment 314.

Figure 4:
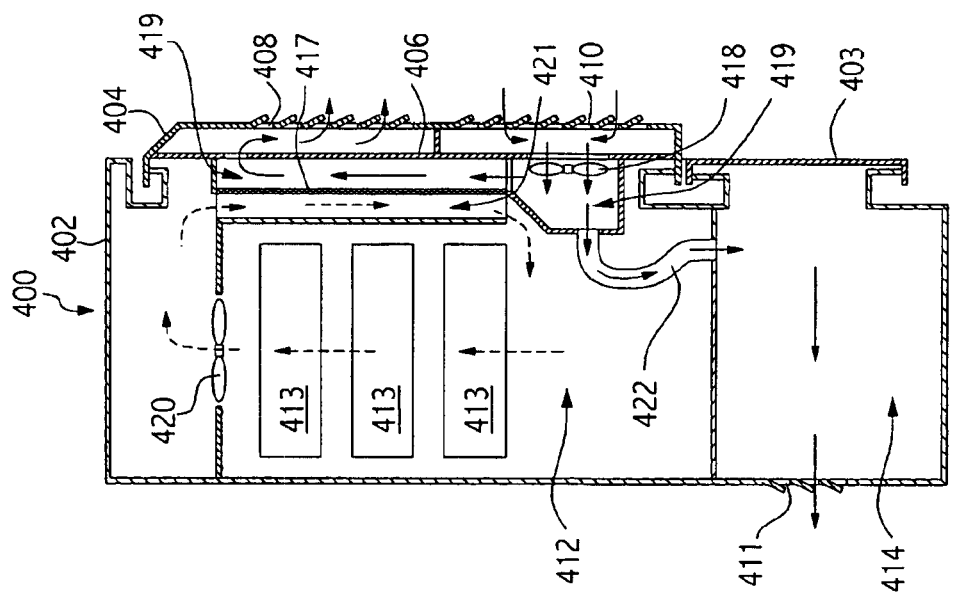
FIG. 4 is a cutaway side view of an alternate embodiment of a weatherproof cabinet with multiple compartment cooling such as that depicted in FIG. 3 that has a door mounted heat exchanging unit.

FIG. 4 is a cutaway side view of an alternate embodiment of a weatherproof cabinet 400 with multiple compartment cooling such as that depicted in FIG. 4 that has a door mounted heat exchanging unit. In that regard, the cabinet 400 includes may elements and features that are substantially similar to the elements and features of the cabinet 300 of FIG. 3. The cabinet 400 includes a housing 402 and a door 404 with a heat exchanging unit mounted to it. The rear wall of the housing 402 typically includes one or more rear vents 411, and the door 404 typically includes one or more upper vents 408 and one or more lower vents 410. The cabinet 400 also includes an electronics compartment 412 which typically holds electronic equipment 413. The cabinet 400 further includes a battery compartment 414, and the rear vents 411 typically provide an opening at the rear of the battery compartment 414 to allow air or other gaseous flow through the battery compartment 414, for example hydrogen produced by batteries. Additionally, the cabinet 400 includes a lower panel 403 that covers the front of the battery compartment 414 and may also cover the front of the cable entrance compartment (not shown). The cabinet 400 may also include a cable entrance compartment (not shown) which typically provides a location where one or more power cables, telecommunications cables, and/or other components can be routed into the cabinet 400.

The cabinet 400 also includes a heat exchanging unit 406, as mentioned above, that is typically mounted to the door 404, as depicted in FIG. 4. The heat exchanging unit 406 typically includes at least a heat exchanging core 417, an external duct 419, and an internal duct 421. The cabinet 400 also typically includes one or more external fans 418 that may, for example, be integrated elements of the heat exchanging unit 406 and mounted within the external duct 414. The cabinet 400 further typically includes one or more internal fans 420 that are typically mounted in the electronics compartment 412. The electronics compartment 412 may also include one or more internal walls that serve to facilitate the circulation of internal air by, for example, channeling the air to the internal fans 420 and past the electronics equipment 413.

As discussed above, the foregoing elements of the cabinet 400 are at least substantially similar in characteristics to their named counterparts discussed above with respect to FIG. 3. Further, the operation of the elements, for example, to cool the compartments of the cabinet 400 is substantially similar to the operation of the elements described above with respect to the cabinet 300 of FIG. 3. However, in variation to the cabinet 300, this embodiment of the cabinet 400 includes an air flow tube 422 that directs external air from the external duct 419 of the heat exchanging unit 406 into the battery compartment 414. The air flow tube 422 may be constructed of various materials such as plastic, rubber, or other materials which may be known in the art. Factors such as flexibility, thermal characteristics, and durability, for example, may affect the type of materials that the air flow tube 422 is constructed from.

As depicted by the solid flow lines in FIG. 4, external air that flows into the battery compartment 414 from the air flow tube 422 typically flows out of the rear vents 411. The volume and pressure of the external air that flows through the battery compartment 414 may be varied by varying the size and/or shape of the air flow tube 422 and by varying the size, shape, and/or configuration of the rear vents 311. Thus, the flow of external air through the battery compartment 414 may be varied to, for example, reduce or prevent the undesirable accumulation of excessive particles and debris on equipment enclosed in the battery compartment 414 and control the amount of cooling supplied to the battery compartment 414.

Figure 5A:
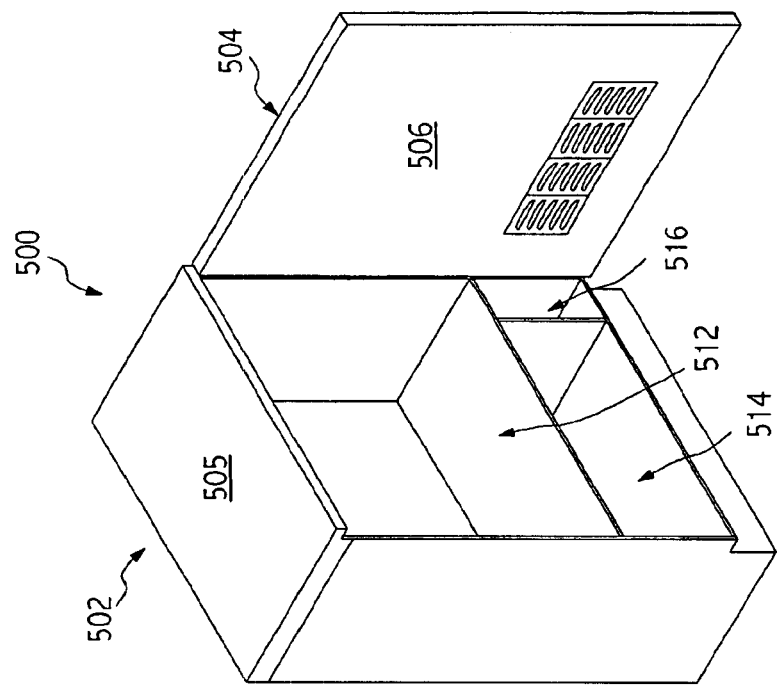
FIG. 5A is a front perspective view of a weatherproof cabinet with multiple compartment cooling that has a wall mounted heat exchanging unit.

FIGS. 5A and 5B show a front and rear perspective view, respectively, of a weatherproof cabinet 500 with multiple compartment cooling that has a wall mounted heat exchanging unit.

The cabinet 500 includes a housing 502 and a door 504. Although not depicted, in some embodiments, the cabinet 500 may include more than one door—for example, the cabinet 500 may include doors on opposite sides of the cabinet 500 or adjacent to each other on the same side of the cabinet 500. The housing 502 typically has several walls of various shapes and sizes as depicted, for example, in FIGS. 5A–5B. The door 504 is typically attached to one or more walls of the housing 502 by some means for attachment, such as hinges, screw fasteners, or other elements, which may be known in the art. A heat exchanging unit 506 is typically mounted to a wall of the cabinet 500, for example to the rear wall. Although not depicted, in some embodiments, the cabinet 500 may include more than one heat exchanging unit mounted to it. The heat exchanging unit 506 will be discussed further below with respect to other figures.

As depicted in FIGS. 5A–5B, the door 504 of the cabinet 500 typically includes one or more front vents 511. Further, the rear wall of the housing 502 typically includes one or more vents 508, 510. Although depicted in a vertical arrangement in FIG. 5B, in some embodiments, the vents 508, 510 may be positioned in other arrangements, such as horizontal. Further, the vents 508, 510 may alternately be included on another wall of the housing 502, instead of the rear wall, or additional vents (not depicted) may be included on other walls of the housing 502 as well. These vents 508, 510, 511 may be provided in various sizes, shapes, and configurations and typically provide one or more openings for the through-flow of air in the cabinet 500. Moreover, the vents 508, 510, 511 may be shaped or otherwise configured to minimize the ingress of moisture and debris into the cabinet 500, for example, in the form of wind-swept rain, dust, or other particles. The vents 508, 510, 511 may also be at least partially covered by some means for filtering (not depicted), such as filter media, screening, or other elements, which may be known in the art, to minimize the ingress of moisture and debris into the cabinet 500.

In order to facilitate the weatherproof characteristics of the cabinet 500, the housing 502 and door 504 may include other features that promote such characteristics. For example, as depicted in FIGS. 5A–5B, the top wall 505 of the housing 502 may extend over the door 504 when it is in a closed position in order to minimize the accumulation and ingress of moisture, for example from rain or snow, at the top section where the closed door 504 and housing 502 meet. As another example, the door 504 and/or the surface of the housing 502 that contacts the door 504 when it is closed may include some means for sealing (not depicted) the cabinet 500, such as one or more gaskets, seals, or other elements, which may be known in the art. Other elements that facilitate the weatherproof characteristics of the cabinet 500, and which may be known in the art, may be included as part of the cabinet 500 within the scope of the invention.

As depicted in FIG. 5A, the interior of the cabinet 500 may include several compartments. The cabinet 500 typically includes a main compartment 512 that usually serves to enclose electronic equipment that is installed in the cabinet 500. The main compartment 512 is typically formed of one or more walls of the housing 502. Alternately, in some embodiments, the main compartment 512 may be formed of one or more separate walls from the walls of the housing 502. In such embodiments, the main compartment 512 may be spaced from the walls and/or compartments of the cabinet 500 to provide thermal insulation of the main compartment 512 from the other compartments of the cabinet 500. Typically, the door 504 serves as a wall of the main compartment 512, for example as the front wall, and the main compartment 512 provides a weatherproof enclosure to equipment installed within it when the door 504 is in a closed position.

The cabinet 500 typically also includes an auxiliary compartment 514 which usually encloses batteries and related equipment. As depicted in FIG. 5A, one or more walls of the auxiliary compartment 514 may be formed from the walls of the housing 502. Further, the door 504 typically serves as a wall (for example, the front wall) of the auxiliary compartment 514. In some embodiments, however, a separate panel may be provided as such wall of the auxiliary compartment 514 and may be attached to the compartment 514, for example, by some means for attachment as discussed above.

An entrance compartment 516 is also typically included in the cabinet 500. The entrance compartment 516 typically provides a location on the cabinet 500 where one or more power cables, telecommunications cables, and/or other components can be routed into the cabinet 500, for example, from one or more conduits or a trench. In that regard, the bottom wall of the entrance compartment 516 typically has one or more openings (not depicted) for cables and/or other components to be passed through and into the cabinet 500. Furthermore, other walls of the entrance compartment 516 may also have openings (not depicted) so that cables or other components can be routed to other compartments within the cabinet 500. One or more of the openings in the walls of the entrance compartment 516 may be fitted with some means for connecting (not depicted), such as a cable connector, a strain relief cable connector, or other components, which may be known in the art—such means for connecting may also provide a seal or barrier between the compartments. As depicted in FIG. 5A, one or more walls of the entrance compartment 516 may be formed from the walls of the housing 502. Further, the door 504 typically serves as a wall (such as the front wall) of the entrance compartment 516, although in some embodiments, a separate wall panel may be provided and attached to the compartment 516, for example, by some means for attachment as discussed above.

The cabinet 500 may also include other compartments that serve various purposes within the scope of the invention. The various elements of the cabinet 500, such as the walls of the housing 502 and the door 504, may be constructed of various materials, such as metal, plastic, or other materials, which may be known in the art. Factors such as thermal characteristics, strength, and durability, for example, may affect the type of materials that the various elements of the cabinet 500 are constructed from.

FIG. 6 is cutaway side view of an embodiment of a weatherproof cabinet with multiple compartment cooling such as that depicted in FIGS. 5A–5B that has a wall mounted heat exchanging unit. The cabinet 600 has many substantially similar characteristics to the cabinet 500 discussed above with respect to FIGS. 5A–5B. The cabinet 600 has a housing 602, which typically surrounds various compartments within the cabinet 600, and a door 604, which typically serves as a wall (such as the front wall) of the cabinet 600 and the various compartments within it when the door 604 is in a closed position. The housing 602 and door 604 have substantially similar characteristics to the housing 502 and door 504, respectively, that were described above with respect to FIGS. 5A–5B. In that regard, the rear wall of the housing 502 typically includes one or more upper vents 608 and one or more lower vents 610, and the door 604 typically includes one or more front vents 611, as depicted in FIG. 6. These vents 608, 610, and 611 are substantially similar to the vents 508, 510, and 511, respectively, described above with respect to FIGS. 5A–5B. Furthermore, the rear wall of the cabinet 600 typically has a heat exchanging unit 606 mounted to it, which will be described further below.

The cabinet 600 includes an electronics compartment 612 which typically holds electronic equipment 613, such as telecommunications equipment. The electronics compartment 612 typically has substantially similar characteristics to the main compartment 512 discussed above with respect to FIG. 5A. For example, the electronics compartment 612 is typically formed of one or more walls of the housing 602, although in some embodiments, the electronics compartment 612 may be formed of one or more separate walls from the walls of the housing 602. In addition to the weatherproof environment generally provided within the cabinet 600, the electronics compartment 612, in some embodiments, may further provide a water-tight and/or air-tight environment to the electronics equipment 613 installed within it when the door 604 of the cabinet 600 is in a closed position.

The cabinet 600 also typically includes a battery compartment 614 which typically holds one or more batteries and related equipment. The battery compartment 614 is typically substantially similar in characteristics to the auxiliary compartment 514 discussed above with respect to FIG. 5A. As depicted in FIG. 6, the front vents 611 typically provide an opening at the front of the battery compartment 614 to allow air or other gaseous flow through the battery compartment 614, for example hydrogen produced by batteries—this feature will be discussed further below.

Although not shown in FIG. 6, a cable entrance compartment is also typically included in the cabinet 600. This cable entrance compartment typically has substantially similar characteristics to the entrance compartment 516 discussed above for FIG. 5A. For example, the cable entrance compartment typically provides a location where one or more power cables, telecommunications cables, and/or other components can be routed into the cabinet 600. The cable entrance compartment may also include one or more openings in the walls of the cable entrance compartment to facilitate the flow of air through the cabinet 600.

As discussed above, the cabinet 600 includes a heat exchanging unit 606 that is typically mounted to the rear wall of the cabinet 600, as depicted in FIG. 6. The heat exchanging unit 606 may have various features and configurations, which may be known in the art, such as those of a typical weatherproof heat exchanger, for example. Typically, the heat exchanging unit 606 includes at least several elements. The heat exchanging unit 606 typically includes a heat exchanging core 617. The heat exchanging core 617 may include one or more extended or convoluted surfaces (such as fins), heat pipes, thermoelectric devices (for example, that operate by Peltier effect), or other heat exchanging elements which may be known in the art. The heat exchanging unit 606 also typically includes an external duct 619. The external duct 619 typically directs external air across the heat exchanging core 617. As depicted in FIG. 6, the upper and lower vents 608, 610 typically provide one or more openings through the rear wall of the cabinet 600 into the external duct 619. Thus, external air may flow in and/or out of the external duct 619 through the upper and lower vents 608, 610.

The heat exchanging unit 606 also typically includes an internal duct 621. The internal duct 621 typically directs air circulated within one or more compartments of the cabinet 600 across the heat exchanging core 617. The cabinet 600 may further include one or more external fans 618 that may, for example, be integrated elements of the heat exchanging unit 606, as depicted in FIG. 6. The external fans 618 typically function to circulate external air through the external duct 619 of the heat exchanging unit 606. The external fans 618 may be provided by various types and configurations of fans which may be known in the art. Typically, the external fans 618 have at least a motor and one or more fan blades. Further, the external fans 618 are typically mounted at a location near or within the external duct 619 by some means for mounting (not depicted), such as bolts, studs, or other elements which may be known in the art. The external fans 618 may be powered by electrical power provided to the cabinet 600 by various means. For example, power may be provided by one or more power cables that pass into the cabinet 600 at the cable entrance compartment (not shown) or by one or more batteries which are installed in the battery compartment 614.

As depicted by the solid flow lines in FIG. 6, the external fans 618 typically cause air to flow through the upper vents 608 and the lower vents 610 and circulate through the external duct 610, including across the heat exchanging core 617. In that regard, the upper and lower vents 608, 610 may function as either inlet or outlet vents of the heat exchanging unit 606 in various embodiments of the invention. For example, as depicted by the solid flow lines in FIG. 6, the lower vents 610 may function as inlet vents while the upper vents 608 may function as outlet vents. In that regard, the operation of the external fans 618 typically causes external air to be drawn into the lower vents 610, circulated through the external duct 619 across the heat exchanging core 617, and blown out of the upper vents 610. Typically, this circulation of external air across the heat exchanging core 617 transfers heat from the core 617 to the external air and subsequently out of the cabinet 600. As mentioned, in other embodiments, the external fans 618 may cause the flow of external air through the vents 608, 610 and the external duct 619 to vary from the foregoing description.

As also depicted by the solid flow lines in FIG. 6, the external fans 618 typically cause external air to flow through one or more openings in the external duct 619, into the battery compartment 614, and subsequently out of the front vents 611. Typically, the main flow of external air through the cabinet 600 flows through the external duct 619 and across the heat exchanging core 617, while a lesser flow of external air flows through the battery compartment 614. However, the volume and pressure of the external air that flows through the battery compartment 614 may be varied by varying the size and/or shape of the openings between the external duct 619 and the battery compartment 614 and by varying the size, shape, and/or configuration of the front vents 611. In that regard, the flow of external air through the battery compartment 614 may be varied to reduce or prevent the undesirable accumulation of excessive particles and debris on equipment enclosed in the battery compartment 614 and to control the amount of cooling supplied to the battery compartment 614. Although not depicted in FIG. 6, external air flow may be provided through other compartments, for example the cable entrance compartment (not shown), in a similar manner to the external air flow provided through the battery compartment 614.

The cabinet 600 also typically includes one or more internal fans 620, as depicted in FIG. 6. Similar to the external fans 618 described above, the internal fans 620 may be provided by various types and configurations of fans which may be known in the art. Furthermore, the internal fans 620 also have at least a motor and one or more fan blades. The internal fans 620 are typically mounted in the electronics compartment 612 by some means for mounting (not depicted), such as bolts, studs, or other elements which may be known in the art. As depicted in FIG. 6, the electronics compartment 612 may also include one or more internal walls that serve to facilitate the circulation of internal air by, for example, channeling the air to the internal fans 620 and past the electronics equipment 613. Similar to the external fans 618, the internal fans 620 may also be powered by electrical power provided to the cabinet 600 by various means, such as by one or more power cables that pass into the cabinet 600 at the cable entrance compartment (not shown) or by one or more batteries which are installed in the battery compartment 614.

As depicted by the dashed flow lines in FIG. 6, the internal fans 620 typically circulate air within the electronics compartment 612. In that regard, the internal fans 620 typically cause internal air to circulate around the electronic equipment 613 enclosed within the electronics compartment 612 and through the internal duct 621 of the heat exchanging unit 606. This circulation of internal air typically causes the transfer of heat generated by the electronics equipment 613 to the heat exchanging core 617 of the heat exchanging unit 606. Thus, the circulation of internal air around the electronics equipment 613 by the internal fans 620 provides cooling to the electronics equipment 613. The heat that is transferred to the heat exchanging core 617 is typically transferred out of the cabinet 600 by the external air flow that circulates through the external duct 619 across the heat exchanging core 617, as depicted by the solid flow lines in FIG. 6. Additional heat transfer out of the cabinet 600 from the electronics compartment 612, the battery compartment 614, and/or other compartments may also occur through the walls of the cabinet 600.

The cooling provided to the electronics compartment 612 and to other compartments of the cabinet 600, such as the battery compartment 614, may also be varied by varying the speed of the external fans 618 and/or the internal fans 620. Moreover, cooling to the various compartments of the cabinet 600 may also be varied by cycling the operation of the external fans 618 and/or internal fans 620 on and off for various time durations. In that regard, the operation of the external fans 618 and/or internal fans 620 may, for example, be activated dependent on the temperature in one or more compartments of the cabinet 600. When the external fans 618 and/or the internal fans 618 are off, the compartments may still be provided with some cooling. For example, heat from the compartments may be transferred out of the cabinet 600 through the vents 608, 610, 611. Furthermore, gases and/or other byproducts generated by equipment held in one or more of the compartments of the cabinet 600, for example hydrogen from the batteries held in the battery compartment 614, may be vented through one or more of the vents 608, 610, 611.

It is emphasized that the above-described embodiments of the present invention are merely possible examples of implementations set forth for a clear understanding of the principles of the invention. Many variations and modifications may be made to the above-described embodiment(s) of the invention without departing substantially from the spirit and principles of the invention. For example, the above-described embodiments of the cabinets 100, 200, 300, 400, 500, and 600 may include one or more doors in various locations and configurations, one or more vents in various locations and arrangements, one or more heat exchanging units in various locations and arrangements, and additional compartments in various locations and configurations. All such modifications and variations are intended to be included herein within the scope of this disclosure and the invention, and protected by the following claims.

What is claimed is:

1. A weatherproof cabinet with multiple-compartment cooling, comprising:

a housing;

an electronics compartment located with the housing and being configured for storing electronics;

a first fan located within the housing and operative to re-circulate internal air within the electronics compartment;

a battery compartment located with the housing and being configured for storing a battery;

a door attached to the housing and being movable to provide selective access to the electronics compartment and the battery compartment, the door comprising:

a heat exchanger core;

a first duct located, at least partially, between the heat exchanger core and an exterior of the door;

a second duct located, at least partially, between the heat exchanger core and the electronics compartment;

an inlet vent pneumatically interconnected with the first duct;

an outlet vent pneumatically interconnected with the first duct;

a second fan located, at least partially, within the first duct; and a partition located within the first duct and separating the inlet vent from the outlet vent such that external air is not drawn into the first duct via the outlet vent during operation of the second fan;

the second fan being operative to draw external air into the first duct via the inlet vent, direct at least a first portion of the external air across the heat exchanger core, and then direct the first portion of the external air out of the first duct via the outlet vent;

an opening located directly between the battery compartment and the first duct; and a battery compartment vent operative to discharge air from the battery compartment such that at least a second portion of the external air drawn into the first duct is directed through the opening and is discharged from the housing via the battery compartment vent.

2. The weatherproof cabinet of claim 1, wherein said door provides a front wall to said housing including said electronics compartment and said battery compartment.

3. The weatherproof cabinet of claim 1, wherein said door provides a front wall to said electronics compartment, and further comprising a lower panel to provide a front wall for said battery compartment, wherein said battery compartment includes the opening.

4. The weatherproof cabinet of claim 3, wherein said opening of said external duct and said opening of said battery compartment are connected by a flexible tubing for the through-flow of air between said external duct and said battery compartment.

5. The weatherproof cabinet of claim 1, further comprising at least one internal wall disposed within said electronics compartment, wherein said internal wall directs the circulation of the internal air within said electronics compartment.

6. The weatherproof cabinet of claim 1, further comprising a cable entrance compartment disposed within said housing, wherein said cable entrance compartment includes at least one additional opening for the routing of cables into said cabinet.

* * * * *